(12) United States Patent
Atherton

(10) Patent No.: US 8,105,888 B2
(45) Date of Patent: Jan. 31, 2012

(54) DIODE ASSEMBLY

(75) Inventor: John Stephen Atherton, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 0 days.

(21) Appl. No.: 12/851,297

(22) Filed: Aug. 5, 2010

(65) Prior Publication Data

US 2011/0034018 A1    Feb. 10, 2011

Related U.S. Application Data

(62) Division of application No. 12/019,904, filed on Jan. 25, 2008, now Pat. No. 7,795,641.

(30) Foreign Application Priority Data

Jan. 26, 2007 (GB) .................................. 0701460.8
May 21, 2007 (GB) .................................. 0709698.5

(51) Int. Cl.
*H01L 21/338* (2006.01)

(52) U.S. Cl. .. 438/176; 438/576; 438/702; 257/E21.362

(58) Field of Classification Search .................. 438/167, 438/176, 179, 576, 702; 257/E21.362
See application file for complete search history.

(56) References Cited

U.S. PATENT DOCUMENTS

| | | | |
|---|---|---|---|
| 4,928,157 A | 5/1990 | Matsunaga | |
| 5,811,857 A | 9/1998 | Assaderaghi et al. | |
| 2005/0212049 A1 | 9/2005 | Onodera | |
| 2006/0027840 A1* | 2/2006 | Wohlmuth | 257/267 |
| 2006/0121658 A1* | 6/2006 | Ahn et al. | 438/167 |
| 2006/0164150 A1 | 7/2006 | Asano | |

OTHER PUBLICATIONS

Notice of Allowance mailed May 12, 2010 regarding U.S. Appl. No. 12/019,904.
Nonfinal Rejection mailed Dec. 3, 2009 regarding U.S. Appl. No. 12/019,904.
Requirement for Restriction/Election mailed Oct. 15, 2009 regarding U.S. Appl. No. 12/019,904.
Search Report dated May 14, 2008 from Great Britain Patent Application No. 0800837.7.

* cited by examiner

*Primary Examiner* — Benjamin Sandvik
*Assistant Examiner* — Wensing Kuo
(74) *Attorney, Agent, or Firm* — Withrow & Terranova, P.L.L.C.

(57) ABSTRACT

A diode assembly comprising first and second diodes each having a different breakdown voltage, each of the first and second diodes comprising a semiconductor substrate; an electrically conducting channel layer on the semiconductor substrate; an upper semiconductor layer on the channel layer, the upper semiconductor layer comprising a recess; first and second ohmic contacts on the upper semiconductor layer on opposite sides of the recess, the ohmic contacts being connected together to form a first diode contact; a gate electrode within the recess, the gate electrode forming a second diode contact; wherein the area of the recess of the first diode covered by the first gate electrode is different to the area of the recess of the second diode covered by the second gate electrode.

10 Claims, 9 Drawing Sheets

Diode Breakdown (Volts) vs. Distance *d* (μm)

DIODE ASSEMBLY

This application is a Divisional of U.S. patent application Ser. No. 12/019,904, filed Jan. 25, 2008, now U.S. Pat. No. 7,795,641, which claims priority to United Kingdom Patent Application Nos. 0701460.8, which was filed on Jan. 26, 2007, and 0709698.5, which was filed on May 21, 2007, the disclosures of which are incorporated herein by reference in their entireties.

FIELD OF THE DISCLOSURE

The present invention relates to a diode assembly and also a method of manufacture of a diode assembly. More particularly, but not exclusively, the present invention relates to a diode assembly comprising at least two diodes, each diode comprising a gate within a recess, the gates and recesses being arranged such that the area of the recess not covered by the gate is different for the two diodes.

BACKGROUND

Electrostatic discharge (ESD) is a major issue for semiconductor circuits, particularly GaAs based circuits. A typical approach to providing ESD protection is to include diodes across the circuits to be protected. The diodes can be configured in either of forward or reverse biased configurations. In the forward biased configuration a number of diodes are connected in series to create a protection circuit with a trigger set by the barrier height of the diode multiplied by the number of diodes in the chain. This approach has the advantage that the trigger voltage can be scaled by the number of diodes in the chain. However, it has the disadvantage that the implementation can be large and require significant area on the integrated circuit. The typical turn on voltage for a diode is around 0.7 volts so creating a diode chain with a 14 volt trigger (for example) requires 20 diodes connected in series.

An alternative approach is to use a diode in reverse bias. In this case the trigger voltage is set by the diode's breakdown voltage which is typically 10-20 Volts. This is compact but is set by the intrinsic properties of the diode which are not easily altered.

The device according to the invention seeks to overcome the drawbacks of the prior art.

SUMMARY

Accordingly, in a first aspect, the present invention provides a diode assembly comprising first and second diodes each having a different breakdown voltage, each of the first and second diodes comprising a semiconductor substrate;

an electrically conducting channel layer on the semiconductor substrate;

an upper semiconductor layer on the channel layer, the upper semiconductor layer comprising a recess;

first and second ohmic contacts on the upper semiconductor layer on opposite sides of the recess, the ohmic contacts being connected together to form a first diode contact;

a gate electrode within the recess, the gate electrode forming a second diode contact;

wherein the area of the recess of the first diode covered by the first gate electrode is different to the area of the recess of the second diode covered by the second gate electrode.

The diode assembly according to the invention is compact and also has trigger voltages which may be easily set during manufacture.

Preferably, the first and second diodes are different portions of a semiconductor substrate.

The semiconductor substrate can be GaAs.

At least one of the diodes can comprise a FET, preferably a pHEMT

The recess of at least one of the first and second diodes can comprise a flat base between side walls.

Preferably, the recess of each of the first and second diodes comprises a flat base between side walls.

Preferably, the distance between the edge of the gate and the side walls in the first and second recesses is d1 and d2 respectively, d1 being different to d2.

The width of the base of the recess of the first diode can different to the width of the base of the second recess.

The width of the gate in the recess of the first diode can be different to the width of the gate in the recess of the second diode.

A diode assembly can further comprise at least one further diode.

In a further aspect of the invention there is provided a method of manufacture of a diode assembly comprising the steps of providing a semiconductor substrate, the substrate having an electrically conducting channel layer thereon and an upper semiconductor layer on the channel layer;

providing a first covering layer on the upper semiconductor layer, the covering layer having first and second recess defining apertures thereon, etching first and second recesses in the semiconductor layer through the first and second recess defining apertures respectively;

providing a second covering layer having first and second gate defining apertures therein;

depositing first and second gates in the first and second recesses through the first and second gate defining apertures respectively;

wherein the area of the first recess covered by the first gate electrode is different to the area of the second recess covered by the second gate electrode.

The method according to the invention enables the manufacture of a compact diode assembly having a variable trigger voltage which can be set by design.

Preferably, the second covering layer is provided on the first covering layer with the gate defining apertures extending through recess defining apertures.

Alternatively, the first covering layer is removed before the second covering layer is provided on the upper semiconductor layer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

The present invention will now be described by way of example only and not in any limitative sense with reference to the accompanying drawings in which.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
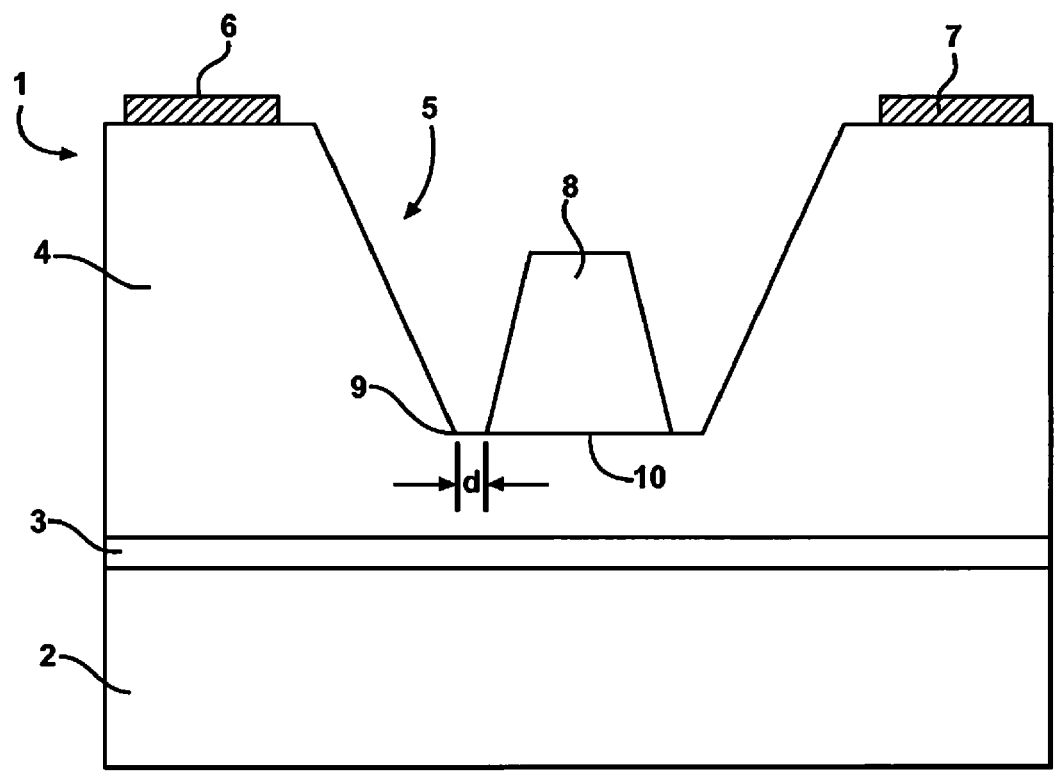
FIG. 1 shows a FET with the source and drain connected together to make a diode.

Shown in FIG. 1 is a FET 1 in cross section. The FET 1 comprises a GaAs semiconductor substrate 2 having an electrically conducting channel layer 3 thereon. Arranged on the channel layer 3 is an upper semiconductor layer 4. The upper semiconductor layer 4 comprises a recess 5. Positioned on either side of the recess 5 are source and drain contacts 6-7. The source and drain 6-7 are connected together to make a first diode contact. Positioned within the recess 5 is a gate 8 which acts as a second diode contact.

The operation of such FETs is known and will not be described in detail.

The breakdown voltage of such a transistor used as a diode depends upon the area of the recess 5 covered by the gate 8. For a FET 1 with the geometry shown in FIG. 1 this is related to the distance d between the edge of the gate 8 and the edge 9 of the base 10 of the recess 5. If the gate 8 is not symmetrically disposed within the recess 5 the relevant distance is the distance between the edge of the recess 5 and the closest gate edge 8.

Figure 2:
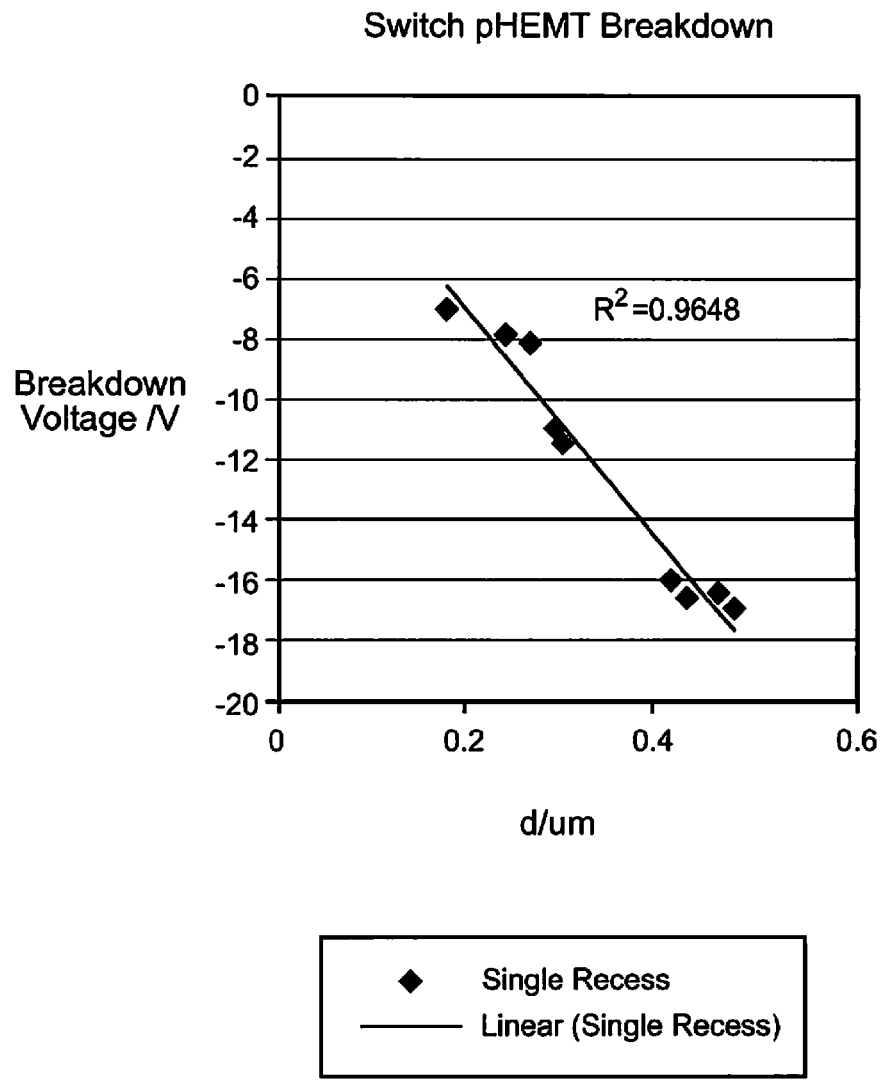
FIG. 2 shows breakdown voltage of the diode of FIG. 1 as a function of distance d.

Shown in FIG. 2 is a plot of breakdown voltage against distance d for a pHEMT used as a diode. As can be seen, the magnitude of the breakdown voltage increases as distance d increases.

Figure 3:
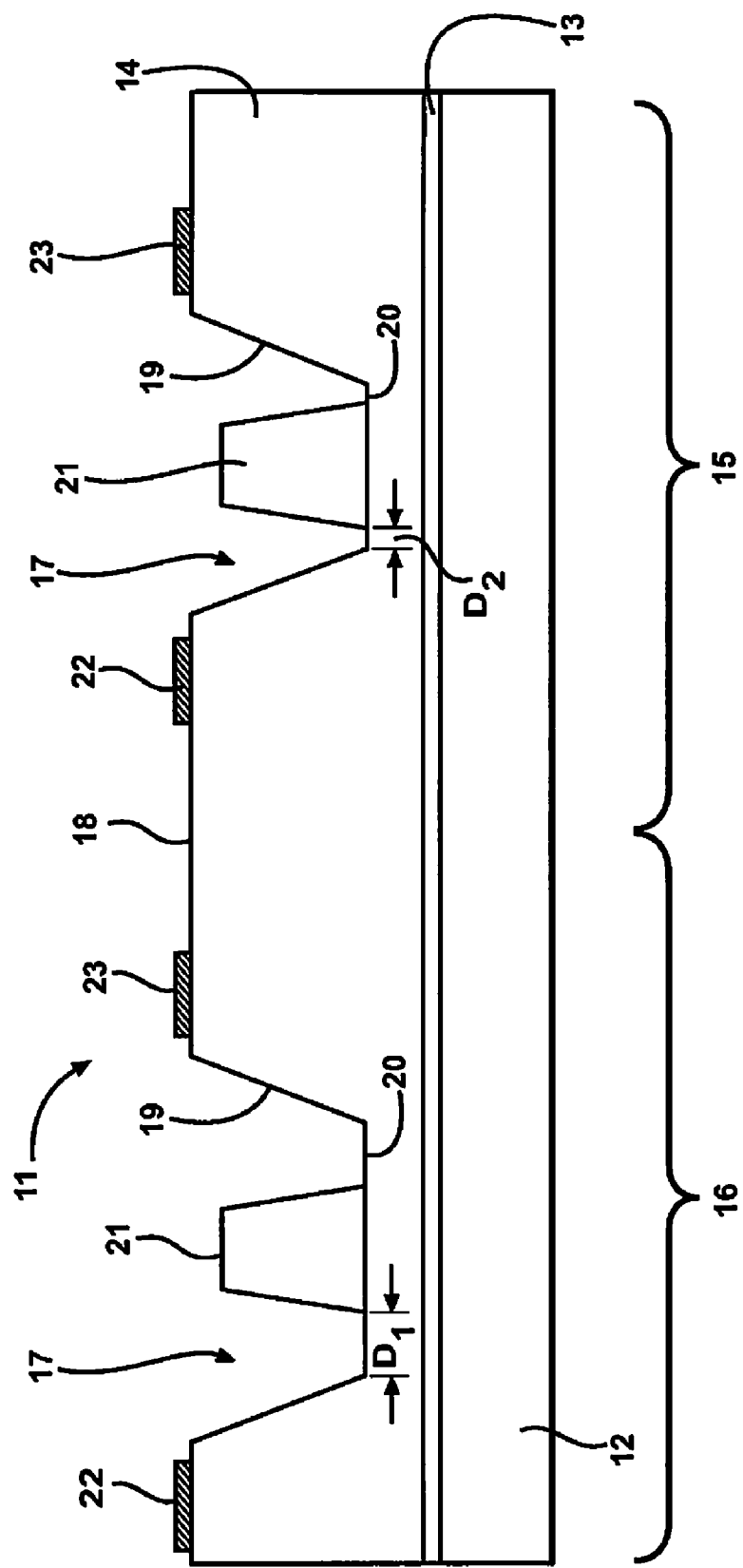
FIG. 3 shows a diode assembly according to the invention in cross section.

Shown in FIG. 3 is a diode assembly 11 according to the invention. The diode assembly 11 relies upon the principle shown in FIG. 2. The diode assembly 11 comprises a semiconductor substrate 12. On the substrate 12 is an electrically conducting layer 13. On the electrically conducting layer 13 is an upper semiconductor layer 14. Each of the diodes comprises a separate diode portion 15,16 of the substrate 12. Each diode portion 15,16 comprises a recess 17 in the upper semiconductor layer 14. The mouth of each recess 17 is in the face 18 of the first semiconductor layer 14 remote from the electrically conducting layer 13. As is typical with recesses formed by etching, the recess 17 comprises steep side walls 19 and a relatively flat base 20. Positioned on the base 20 of each recess 17 is a gate 21. On each side of each recess 17 are source and drain contacts 22,23. The distance between the edge of the base 20 of the recess 17 and the gate 21 for the diodes are d1 and d2 respectively. d1 and d2 are different for the two diodes resulting in the diodes having different breakdown voltages.

The two diodes of the diode assembly 11 can be connected in series across a circuit to be protected so producing an ESD protection circuit having a defined trigger voltage. By adjusting the distances d1 and d2 during the manufacturing process one can tailor the trigger voltage to the required application.

Alternatively, the diodes of the diode assembly 11 can be connected across different circuits to be protected, possibly on the same substrate. The diode assembly 11 according to the invention allows for different diodes with different trigger voltages in the same integrated circuit. Because the only difference between the diodes is the distance d they can be made as part of the same process flow.

Shown in FIGS. 4(a) to 4(e) is a method of manufacture of a diode assembly 11 according to the invention. In a first step a semiconductor substrate 12 is provided. Arranged on the substrate 12 is an electrically conducting layer 13. On the electrically conducting layer 13 is an upper semiconductor layer 14. Source and drain ohmic contacts 22,23 are deposited on the upper semiconductor layer 14 as shown. Each source 22 is connected to an adjacent drain 23 to form a first diode contact in the resulting diode assembly 11.

A first covering layer 24 comprising a photoresist 24 is provided on the upper semiconductor layer 14. The photoresist 24 is illuminated through a mask (not shown). The mask and the exposed portions of the photoresist 24 are removed to produce first and second recess defining apertures 25,26 in the covering layer 24. Each aperture 25,26 is arranged between a connected source drain pair 22,23.

Figure 4A:
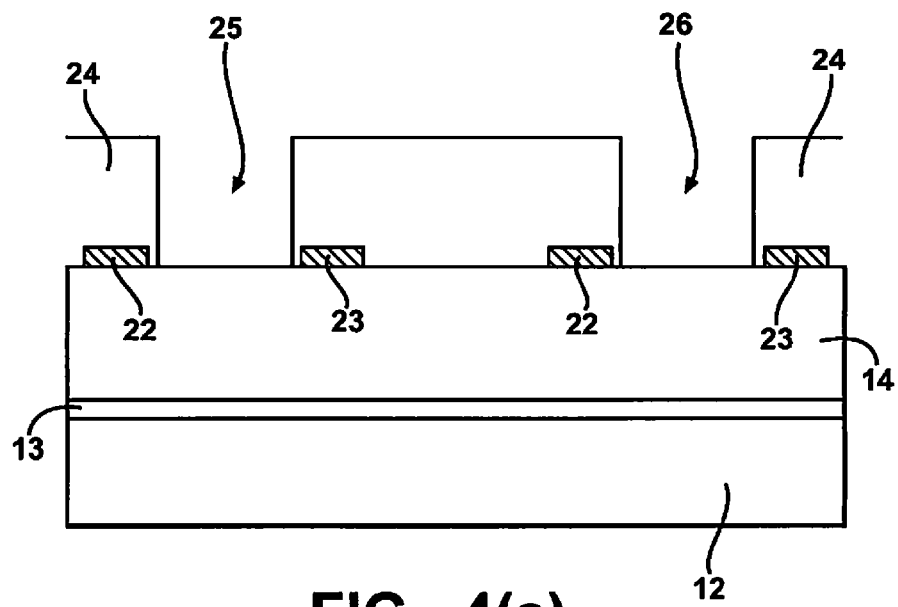
FIGS. 4(a)-4(e) show a method of manufacture of a diode assembly according to the invention; and, FIGS. 5(a)-5(e) show shows an alternative method of manufacture of a diode assembly according to the invention.
Figure 4B:
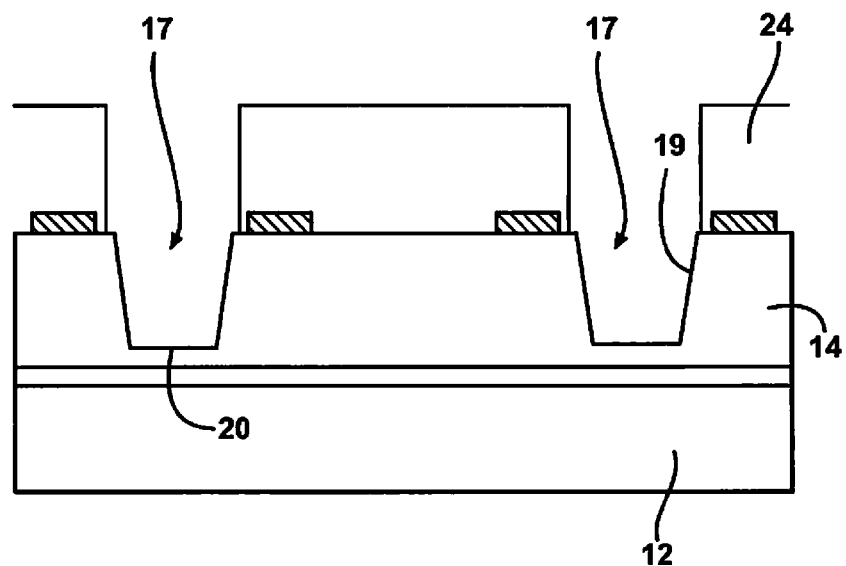

The upper semiconductor layer 14 is then etched through the recess defining apertures 25,26 to form recesses 17 as shown in FIG. 4(b). As is characteristic of etched recesses, the recesses 17 have steep side walls 19 and a relatively flat base 20.

Figure 4C:
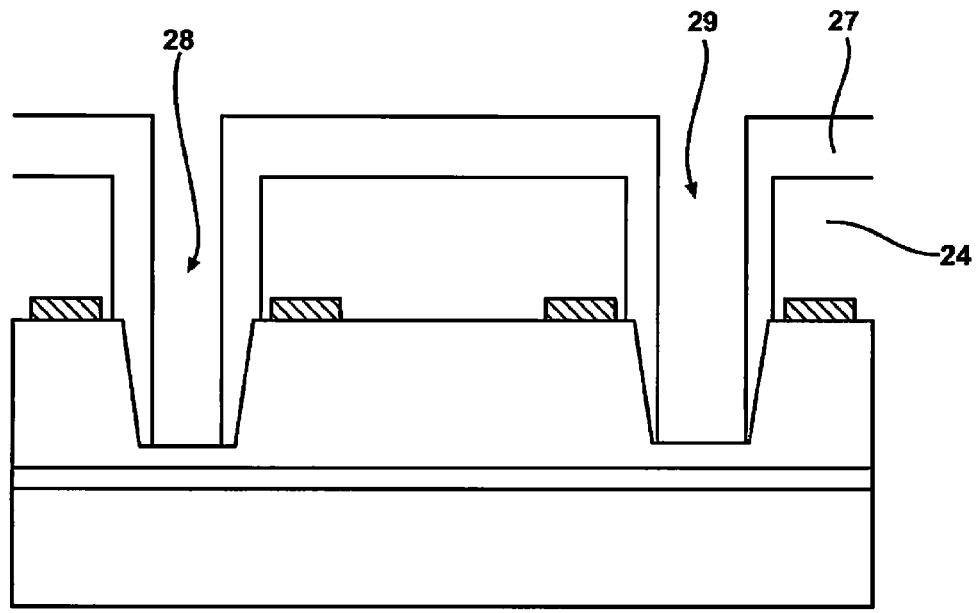

A second covering layer 27 comprising a photoresist 27 is then provided on the first covering layer 24. The second covering layer 27 is illuminated through a mask (not shown). The mask and exposed portions of the second covering layer 27 are removed to define first and second gate defining apertures 28,29 as shown in FIG. 4(c). The gate defining apertures 28,29 and recess defining apertures 25,26 are aligned as shown.

Figure 4D:
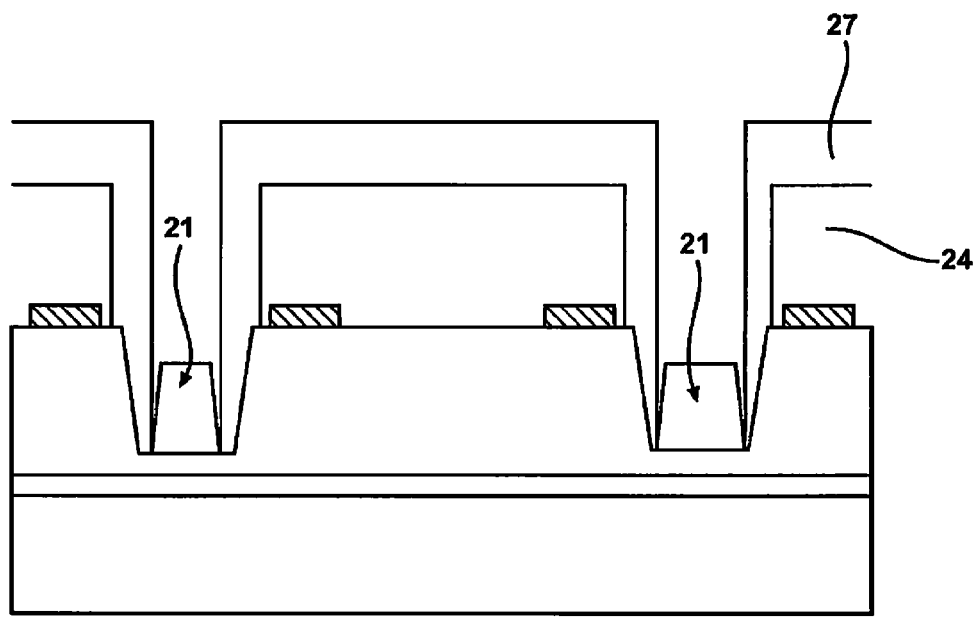

Gates 21 are then deposited through the gate defining apertures 28,29 as shown in FIG. 4(d). The gates 21 form the second diode contacts of the diodes of the resulting diode assembly 11.

Figure 4E:
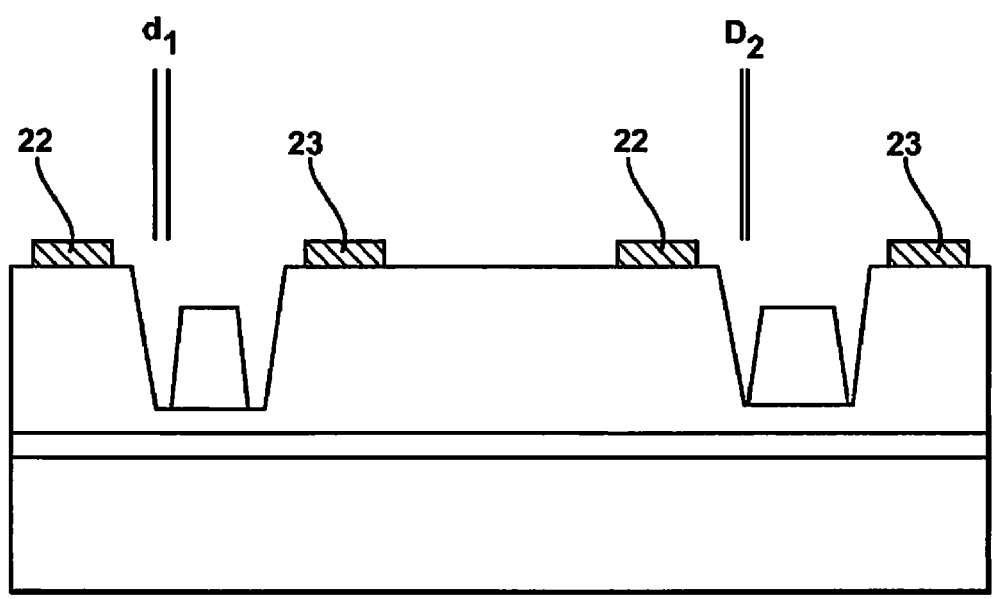
Figure 5A:
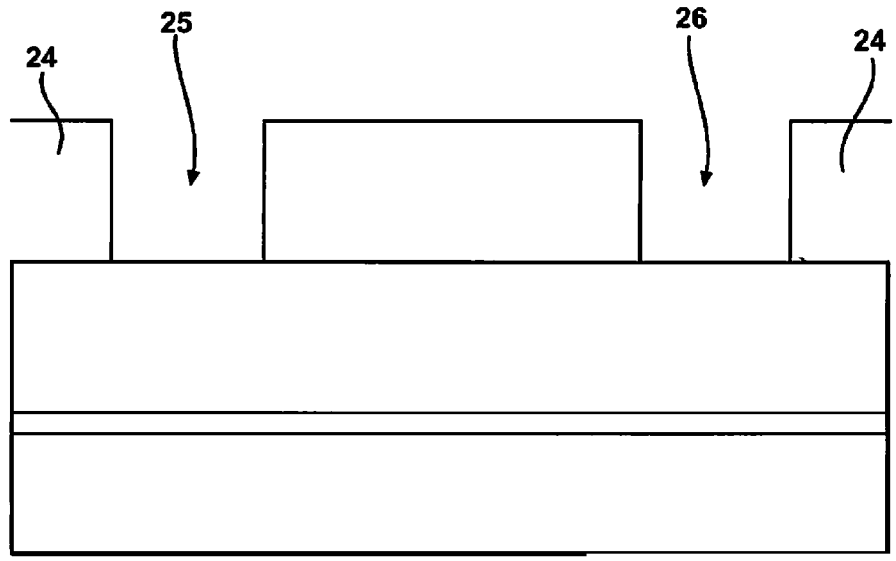
Figure 5B:
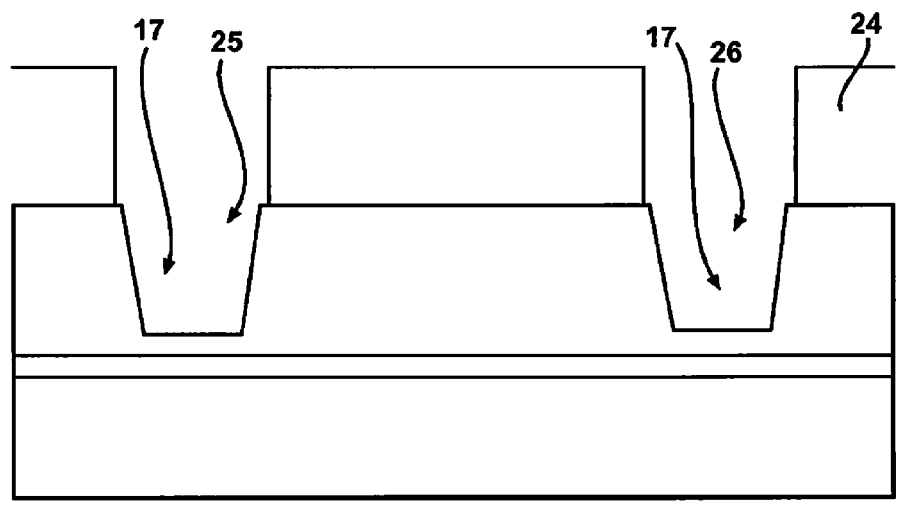
Figure 5C:
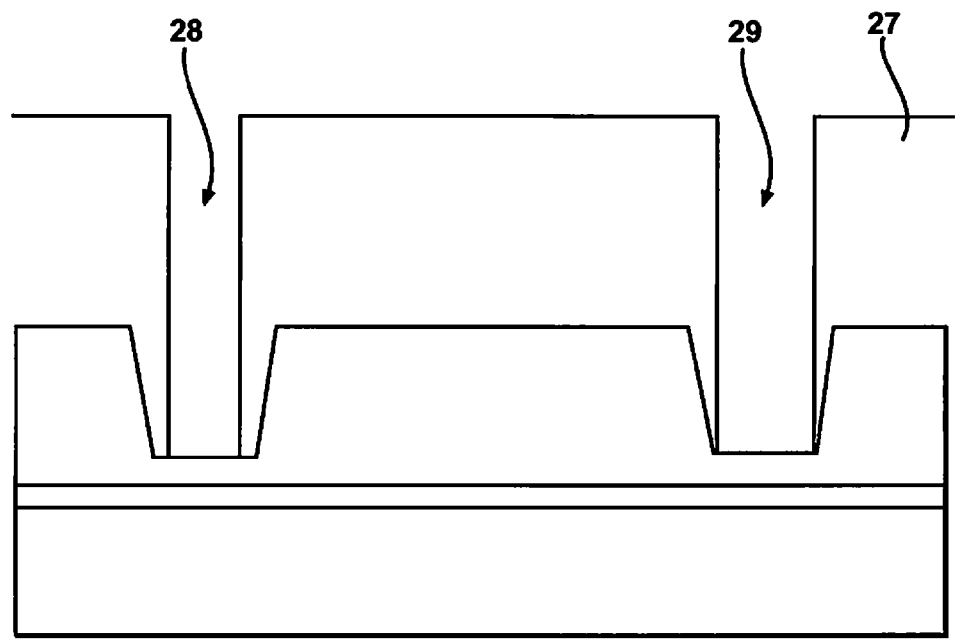
Figure 5D:
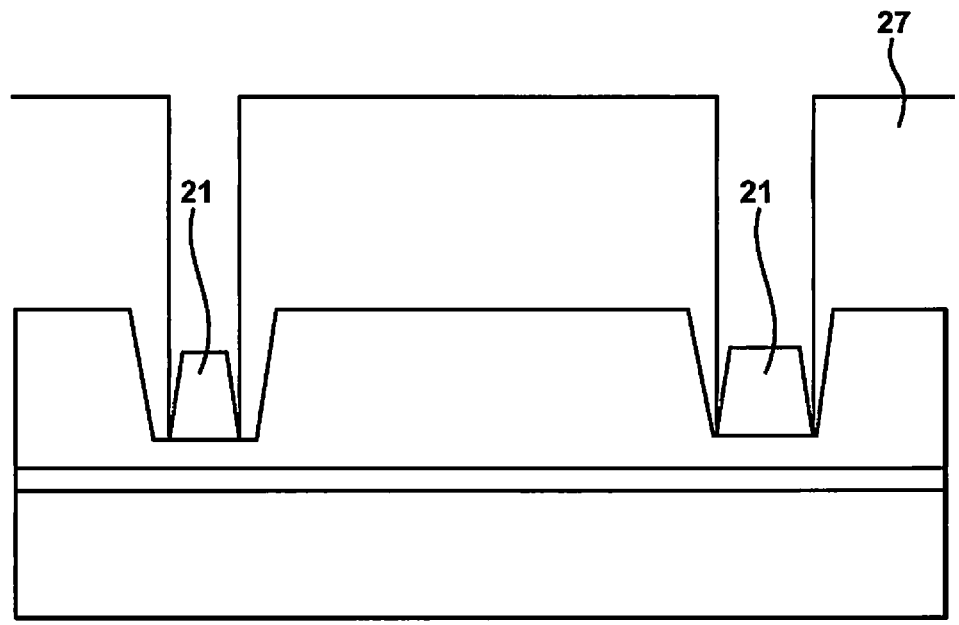
Figure 5E:
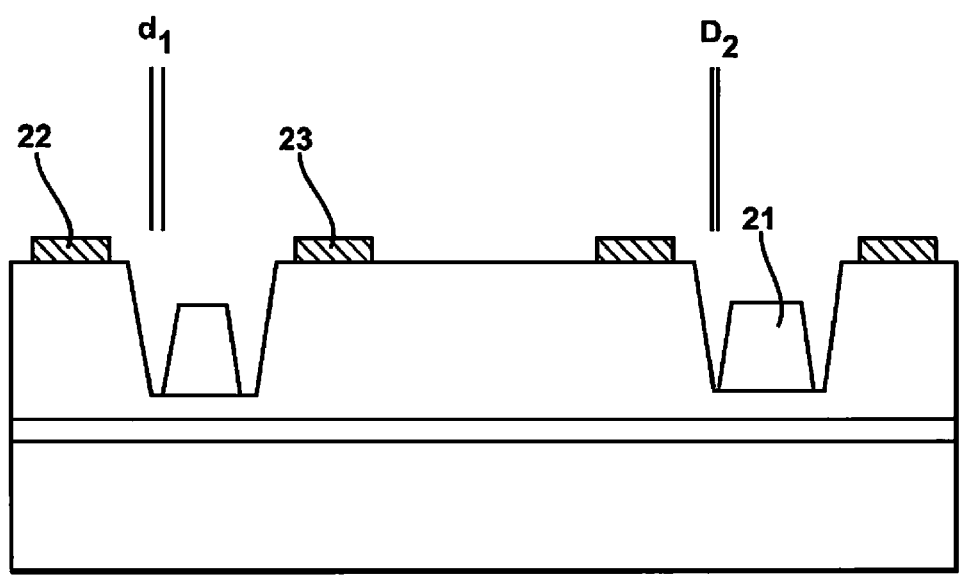

Finally, the covering layers 24,27 are removed as shown in FIG. 4(e).

The resulting diode assembly 11 shown in FIG. 4(e) is arranged such that d1 is not equal to d2. The two diodes of the assembly 11 therefore have different breakdown voltages. This can be achieved in a number of different ways. In one embodiment the recess defining apertures 25,26 are both the same size with the gate defining apertures 28,29 being different sizes to each other. In an alternative embodiment the gate defining apertures 28, 29 are the same size as each other whilst the recess defining apertures 25,26 are different sizes to each other. Combinations of the two with both gate and recess defining apertures 25,26,28,29 being different sizes are also possible.

Shown in FIGS. 5(a) to 5(e) is an alternative method of manufacture of a diode assembly 11 according to the invention. In this embodiment the first covering layer 24 is removed before the second covering layer 25 is provided.

Those skilled in the art will recognize improvements and modifications to the embodiments of the present disclosure. All such improvements and modifications are considered within the scope of the concepts disclosed herein and the claims that follow.

What is claimed is:

1. A method of manufacture of a diode assembly comprising the steps of:
   providing a semiconductor substrate, the substrate having an electrically conducting channel layer thereon and an upper semiconductor layer on the channel layer;
   providing a first covering layer on the upper semiconductor layer, the covering layer having first and second recess defining apertures thereon;
   etching first and second recesses in the semiconductor layer through the first and second recess defining apertures respectively;
   providing a second covering layer having first and second gate defining apertures therein;
   depositing first and second gates in the first and second recesses through the first and second gate defining apertures respectively to form first and second diodes;
   wherein the area of the first recess covered by a first gate electrode is different to the area of the second recess covered by a second gate electrode, such that the first and second diodes have different breakdown voltages.

2. A method as claimed in claim 1, wherein the second covering layer is provided on the first covering layer with the gate defining apertures extending through recess defining apertures.

3. A method as claimed in claim 1, wherein the first covering layer is removed before the second covering layer is provided on the upper semiconductor layer.

4. The method of claim 1, wherein providing the semiconductor substrate comprises providing a GaAs substrate.

5. The method of claim 1, further comprising forming a Field Effect Transistor (FET) with at least one of the first and second diodes.

6. The method of claim 1, wherein etching first and second recesses comprises etching recesses having respective flat bases between respective side walls.

7. The method of claim 1, further comprising forming at least one further diode.

8. The method of claim 6, wherein depositing the first gate comprises depositing the first gate such that a distance between an edge of the first gate and its respective side walls is d1 and depositing the second gate comprises depositing the second gate such that a distance between an edge of the second gate and its respective side walls is d2, wherein d1 is different than d2.

9. The method of claim 8, wherein etching first and second recesses comprises etching recesses having different widths.

10. The method of claim 9, wherein other than the different widths, the first diode and the second diode are substantially the same.

* * * * *